(12) United States Patent
Zhao et al.

(10) Patent No.: US 10,262,617 B2
(45) Date of Patent: Apr. 16, 2019

(54) GATE DRIVING CIRCUIT AND DRIVING METHOD THEREOF, DISPLAY SUBSTRATE, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Jian Zhao, Beijing (CN); Hui Wang, Beijing (CN)

(73) Assignees: BOE TECHNOLOGY GROUP CO., LTD., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/744,455

(22) PCT Filed: Apr. 21, 2017

(86) PCT No.: PCT/CN2017/081422
§ 371 (c)(1),
(2) Date: Jan. 12, 2018

(87) PCT Pub. No.: WO2018/082268
PCT Pub. Date: May 11, 2018

(65) Prior Publication Data
US 2019/0005910 A1    Jan. 3, 2019

(30) Foreign Application Priority Data
Nov. 1, 2016 (CN) .......................... 2016 1 0934970

(51) Int. Cl.
*G11C 19/00* (2006.01)
*G09G 3/36* (2006.01)
*G11C 19/28* (2006.01)

(52) U.S. Cl.
CPC ............ *G09G 3/3677* (2013.01); *G09G 3/36* (2013.01); *G09G 3/3614* (2013.01); *G11C 19/28* (2013.01);
(Continued)

(58) Field of Classification Search
None
See application file for complete search history.

(56) References Cited

U.S. PATENT DOCUMENTS 8,059,780 B2   11/2011   Wang et al.
9,240,156 B2   1/2016    Dai et al.
(Continued)

FOREIGN PATENT DOCUMENTS

CN   103680453 A   3/2014
CN   105118414 A   12/2015

OTHER PUBLICATIONS

International Search Report dated Aug. 23, 2017, issued in counterpart International Application No. PCT/CN2017/081422 (5 pages).
(Continued)

*Primary Examiner* — Tuan T Lam
(74) *Attorney, Agent, or Firm* — Westerman, Hattori, Daniels & Adrian, LLP (57) ABSTRACT

The present invention is related to a gate driving circuit for a display device. The gate driving circuit may comprise x stages of driving shift register units connected in series. Each of the driving shift register units may comprise an input terminal, an output terminal, and a reset terminal. The input terminal may comprise a first input port and a second input port. A row of pixel units driven by the driving shift register unit of the m-th stage may have the same polarity distribution as a row of pixel units driven by the driving shift register unit of the (m−N)-th stage. N is an integer greater than 1. m is an integer and $N+1 \leq m \leq x$.

13 Claims, 8 Drawing Sheets

(52) U.S. Cl.
CPC . *G09G 2310/0286* (2013.01); *G09G 2310/08* (2013.01); *G09G 2320/0252* (2013.01)

(56) References Cited

U.S. PATENT DOCUMENTS

| | | | |
|---|---|---|---|
| 2007/0185920 A1* | 8/2007 | Castro | G06F 17/30578 |
| 2010/0150302 A1* | 6/2010 | Tsai | G11C 19/28 |
| | | | 377/79 |
| 2013/0016804 A1* | 1/2013 | Ahn | G11C 19/28 |
| | | | 377/64 |
| 2014/0022228 A1* | 1/2014 | Bae | H03K 17/16 |
| | | | 345/212 |
| 2014/0049712 A1* | 2/2014 | Yu | G02F 1/13306 |
| | | | 349/34 |
| 2016/0012764 A1* | 1/2016 | Xu | G11C 19/28 |
| | | | 345/204 |
| 2016/0027526 A1* | 1/2016 | Xu | G11C 19/28 |
| | | | 345/215 |
| 2016/0240158 A1* | 8/2016 | Xu | G11C 19/28 |
| 2016/0300542 A1* | 10/2016 | Zhang | G11C 19/28 |
| 2016/0351159 A1* | 12/2016 | Yang | G09G 3/20 |
| 2017/0278473 A1* | 9/2017 | Shang | G09G 3/36 |
| 2018/0053471 A1* | 2/2018 | Lin | G09G 3/3266 |

OTHER PUBLICATIONS

Written Opinion dated Aug. 23, 2017, issued in counterpart International Application No. PCT/CN2017/081422 (4 pages).

* cited by examiner

GATE DRIVING CIRCUIT AND DRIVING METHOD THEREOF, DISPLAY SUBSTRATE, AND DISPLAY DEVICE

CROSS-REFERENCE TO RELATED APPLICATIONS

This application claims the benefit of the filing date of Chinese Patent Application. No. 201610934970.8 filed on Nov. 1, 2016, the disclosure of which is hereby incorporated by reference.

TECHNICAL FIELD

This invention relates to a display technology, and more particularly, to a gate driving circuit and a driving method thereof, a display substrate, and a display device.

BACKGROUND

A driving circuit of a liquid crystal display panel includes a gate driving circuit and a source driving circuit. The gate driving circuit comprises a plurality of shift register units connected in series, each of the shift register units corresponding to a row of pixel units. During a display process, the plurality of the shift register units successively outputs a scan signal to turn on the corresponding row of pixel units. The source driving circuit then supplies data signals to the corresponding row of pixel units that are turned on so as to charge the pixel units.

In order to achieve fast charging of pixel units to meet high resolution requirements of a product, an output time of each shift register unit is usually made to exceed a time required for the corresponding row of pixel units to be turned on. Furthermore, there is an overlap between output times of different shift register units so that the turn-on times between the corresponding rows of the pixel units have an overlap.

BRIEF SUMMARY

Accordingly, one example of the present disclosure is a gate driving circuit. The gate driving circuit may comprise x stages of driving shill register units connected in series. Each of the driving shift register units may comprise an input terminal, an output terminal, and a reset terminal. The input terminal may comprise a first input port and a second input port. A first input port of a driving shift register unit of the m-th stage may be connected to an output terminal of a driving shift register unit of the (m−1)-th stage. A second input port of the driving shift register unit of the m-th stage may be connected to an output terminal of a driving shift register unit of the (m−N−1)-th stage. N is an integer greater than 1, x is an integer, m is an integer, and N+1<m≤x.

A row of pixel units driven by the driving shift register unit of the m-th stage may have the same polarity distribution as a row of pixel units driven by a driving shift register unit of the (m−N)-th stage.

The gate driving circuit may further comprise N stages of start shill register units connected in series. An input terminal of a start shift register unit of the p stage may be connected to an output terminal of a start shift register unit of the (p−1)-th stage, wherein p is an integer and 1<p≤N. N may be 2.

The gate driving circuit may further comprise a start signal terminal. An input terminal of a start shift register unit of the first stage may be connected to the start signal terminal. A second input port of a driving shift register unit of the first stage may be connected to the start signal terminal. A first input port of the driving shift register unit of the first stage may be connected to an output terminal of a start shift register unit of the Nth stage. A second input port of a driving shift register unit of the q-th stage may be connected to an output terminal of a start shift register unit of the (q−1) stage. q is an integer and 1<q≤N+1.

An output terminal of the start shift register unit of the p stage may be connected to a reset terminal of the start shift register unit of the (p−1)-th stage. A reset terminal of the start shift register unit of the N stage may be connected to an output terminal of a driving shill register unit of the first stage. An output terminal of the driving shift register unit of the m-th stage may be connected to a reset terminal of the driving shift register unit of the (m−1)th stage.

Each of the driving shift register units may be configured to output an effective signal after at least one of the first input port and the second input port receives an effective signal.

The gate driving circuit May further comprise €t first clock supply terminal and a second clock supply terminal. The first clock supply terminal and the second clock supply terminal may be configured to provide clock signals with opposite phases. A first clock signal terminal of a start shift register unit of the odd-numbered stage and that of a driving shift register unit of the odd-numbered stage may be connected to the first clock supply terminal respectively. A second clock signal terminal of the start shift register unit of the odd-numbered stage and that of the driving shift register unit of the odd-numbered stage may be connected to the second clock supply terminal respectively. A first clock signal terminal of a start shift register unit of the even-numbered stage and that of a driving shift register unit of the even-numbered stage may be connected to the second clock supply terminal respectively. A second clock signal terminal of the start shift register unit of the even-numbered stage and that of the driving shift register unit of the even-numbered stage may be connected to the first clock supply terminal respectively.

Each of the start shift register units may include an input module, a pull-up module, a reset module, and a pull-down module. The input module of the start shift register unit may include a fourth transistor. A gate and a first terminal of the fourth transistor may be connected to the input terminal of the start shift register unit. A second terminal of the fourth transistor may be connected to a pull-up node of the start shift register unit.

Another example of the present disclosure is a display substrate comprising a plurality of rows of pixel units and the gate driving circuit according to one embodiment of the present disclosure. Each of the driving shift register units corresponds to one of the plurality of rows of the pixel units respectively.

Another example of the present disclosure is a display device comprising the display substrate according to one embodiment of the present disclosure.

Another example of the present disclosure is a driving method of the gate driving circuit according to one embodiment of the present disclosure. The driving method may comprise, in each cycle of display cycle, providing an effective signal to the input terminal of the start shift register unit of the first stage, and providing an effective signal to the second input port of the driving shift register unit of the first stage. The driving method may further comprise providing two clock signals with opposite phases by the first clock supply terminal and the second clock supply terminal respectively.

Another example of the present disclosure is a driving shift register unit. The driving shift register unit may comprise an input terminal, an output terminal, a reset terminal, a first clock signal terminal, and a voltage terminal. The input terminal may comprise a first input port and a second input port. The driving shift register may further comprise an input module, a pull-up module, and a reset module. The input module may be connected to the input terminal and a pull-up node respectively. The pull-up module may be connected to the pull-up node, the first clock signal terminal, and the output terminal respectively. The reset module may be connected to the reset terminal, the pull-up node, the output terminal, and the voltage terminal respectively. The input module may be configured to provide an effective signal to the pull-up node when the input terminal receives an effective signal, the pull-up node being a connection node of the input module and the pull-up module. The pull-up module may be configured to electrically connect the first clock signal terminal and the output terminal when the pull-up node receives an effective signal. The reset module may be configured to electrically connect the pull-up node and the output terminal to the voltage terminal respectively when the reset terminal receives an effective signal.

The driving shift register unit may further comprise a second clock signal terminal and a pull-down module connected to the second clock signal terminal, the pull-up node and the output terminal respectively. The pull-down module may be configured to electrically connect the pull-up node and the output terminal to the voltage terminal respectively when the second clock signal terminal receives an effective signal.

The input module of the driving shift register unit may include a first transistor, a second transistor and a third transistor. A gate and a first terminal of the first transistor may be connected to the first input port. A gate and a first terminal of the second transistor may be connected to the second input port. A second terminal of the first transistor may be connected to a second terminal of the second transistor. A first terminal and a gate of the third transistor may be connected to the second terminal of the second transistor respectively. A second terminal of the third transistor may be connected to the pull-up node of the driving shift register unit.

The pull-up module of the driving shift register unit may include a fifth transistor and a storage capacitor. A first terminal of the storage capacitor may be connected to the pull-up node. A second terminal of the storage capacitor may be connected to the output terminal. A gate of the fifth transistor may be connected to the first terminal of the storage capacitor. A first terminal of the fifth transistor may be connected to the first clock signal terminal. A second terminal of the fifth transistor may be connected to the output terminal.

The reset module of the driving shift register unit may include a sixth transistor and a seventh transistor. A gate of the sixth transistor and a gate of the seventh transistor may be connected to the reset terminal respectively. A first terminal of the sixth transistor may be connected to the pull-up node. A first terminal of the seventh transistor may be connected to the output terminal. A second terminal of the sixth transistor and a second terminal of the seventh transistor may be connected to the voltage terminal respectively.

The pull-down module of the driving shift register unit may include an eighth transistor, a ninth transistor, a tenth transistor, an eleventh transistor, a twelfth transistor, a thirteenth transistor, a fourteenth transistor, and a fifteenth transistor. A gate of the thirteenth transistor may be connected to the second clock signal terminal. A first terminal of the thirteenth transistor may be connected to the input terminal. A second terminal of the thirteenth transistor may be connected to the pull-up node. A gate and a first terminal of the ninth transistor may be connected to the second clock signal terminal respectively. A second terminal of the ninth transistor may be connected to a gate of the fifteenth transistor. A first terminal of the fifteenth transistor may be connected to the second clock signal terminal. A second terminal of the fifteenth transistor may be connected to a lint terminal of the fourteenth transistor. A gate of the fourteenth transistor may be connected to the pull-up node. A second terminal of the fourteenth transistor may be connected to the voltage terminal. A gate of the eighth transistor may be connected to the pull-up node. A first terminal of the eighth transistor may be connected to a gate of the fifth transistor. A second terminal of the eighth transistor may be connected to the ineffective signal terminal. A gate of the tenth transistor and a gate of the eleventh transistor may be connected to a second terminal of the fifteenth transistor. A first terminal of the tenth transistor may be connected to the pull-up node. A first terminal of the eleventh transistor may be connected to the output terminal. A second terminal of the tenth transistor and a second terminal of the eleventh transistor may be connected to the voltage terminal. A gate of the twelfth transistor may be connected to the second clock signal terminal. A first terminal of the twelfth transistor may be connected to the output terminal. A second terminal of the twelfth transistor may be connected to the voltage terminal.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which.

DETAILED DESCRIPTION

The present invention is described with reference to embodiments of the invention. Throughout the description of the invention, reference is made to FIGS. 1-9. When referring to the figures, like structures and elements shown throughout are indicated with like reference numerals.

Figure 1:
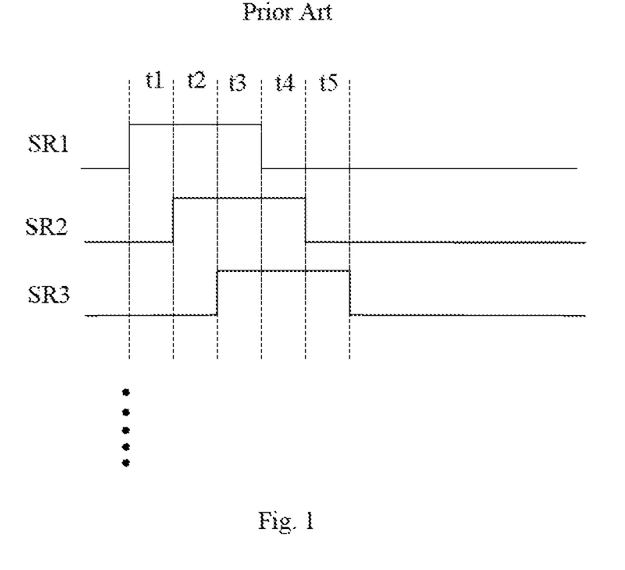
FIG. 1 is a timing chart of an output signal of a gate driving circuit in conventional art.

FIG. 1 shows a timing chart of an output signal of a gate driving circuit in conventional art. Specifically, as shown in FIG. 1, a shift register unit of the first-stage SR1 outputs a high level between phase t1 to phase t3 to turn on the first row of pixel units. A shift register unit of the second stage SR2 outputs a high level between phase t2 to phase t4 to turn on the second row of pixel units, and so on. A source driving circuit provides corresponding data signals for the first row of pixel units at time t3 so that the first row of pixel units is displayed. At the same time, in the t3 phase, SR2 and SR3 also output a high level, the second row and the third row of pixel units are open, so that the data signals are also written to the second and third rows of the pixel units. The t3 phase corresponds to the pre-charging phase for the second and third rows of the pixel units. Thus, in a case where polarity distributions of the rows of the pixel units are the same, when data signals for display are provided for the second and third rows of pixel units, since pre-charging has been performed, the second and third rows of the pixel units can quickly reach corresponding data signal voltages. As a result, writing speed of the data signals is improved. This is especially beneficial for a device having a large size and a high resolution.

Figure 2:
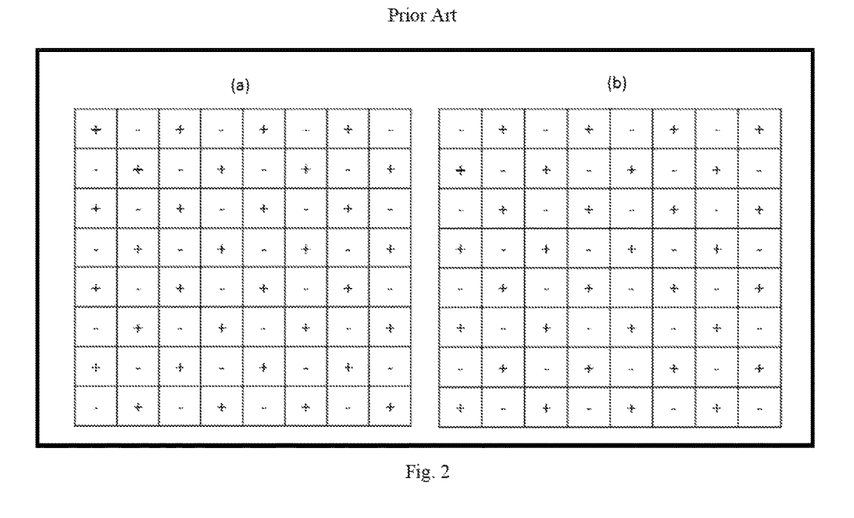
FIG. 2 is a schematic view of polarity distribution of pixel units of two continuous frames in a dot inversion driving mode (a) a first frame, (b) a second frame.

However, a dot inversion driving mode is widely used due to its excellent display effect. As shown in FIG. 2 (a) and FIG. 2(b), polarity of every pixel units is inverted between adjacent frames in the dot inversion driving mode. Polarity of two adjacent pixel units in the same column is also inverted in each frame. In this case, if the driving method in FIG. 1 is adopted, the signals written into the pixel units of the second row in the pre-charging process are opposite in polarity to the actually required data signals. This can result in reverse pre-charging to produce stripes and other adverse display effects.

Figure 3:
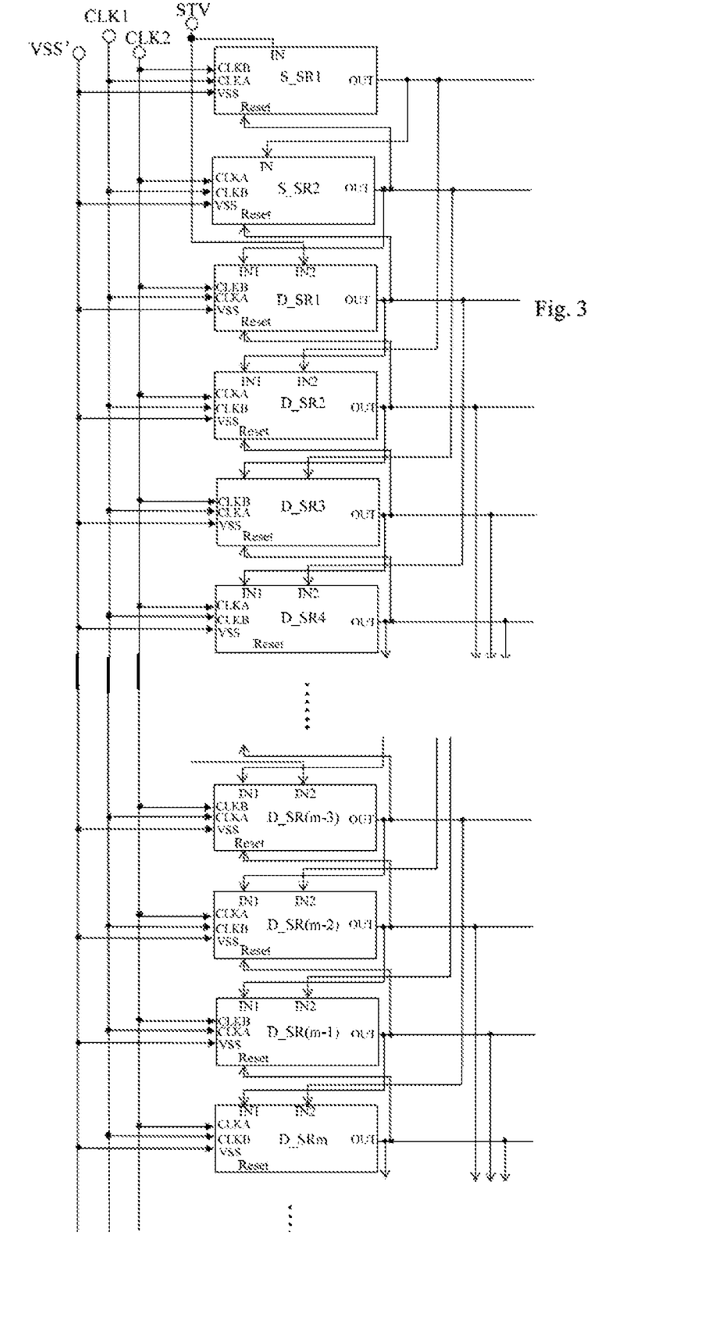
FIG. 3 is a schematic structural view of a gate driving circuit according to one embodiment of the present invention.

FIG. 3 shows a schematic structural view of a gate driving circuit according to one embodiment of the present invention. The gate driving circuit comprises driving shift register units of x stages connected in series such as D_SR1, D_SR2, etc. . . . x is the total number of the driving shift register units in the gate driving circuit.

As shown in FIG. 3, the driving shift register unit comprises an input terminal IN, an output terminal OUT, and a reset terminal Reset. The input terminal IN comprises a first input port IN1 and a second input port IN2. In one embodiment, a first input port IN1 of a driving shift register unit of the m-th stage is connected to an output terminal OUT of a driving shift register unit of the (m-1)-th stage. A second input port IN2 of a driving shift register unit of the m-th stage is connected to an output terminal OUT of a driving shift register unit of the (m-N-1)-th stage. N is an integer greater than 1. x is an integer greater than N+1. m is an integer and N+1<m≤x. The stage at which a driving shift register unit is designated is determined by the order of the driving shift register unit located in all the driving shift register units.

The driving shift register unit is configured to output an effective signal after at least one of the first input port IN1 and the second input port IN2 thereof receives an effective signal. In the present invention, when a second input port IN2 of a driving shift register unit receives an effective signal, the driving shift register unit outputs a corresponding effective signal, which is referred as a second effective signal. When a first input port IN1 of a driving shift register unit receives an effective signal and a second input port IN2 thereof does not receive an effective signal, the driving shift register unit outputs a corresponding effective signal, which is referred as a first effective signal. Each stage of the driving shift register unit outputs a second effective signal earlier than a first effective signal. The second effective signal is used for turning on the corresponding row of pixel units to pre-charge the pixel units. The first effective signal is used for turning on the corresponding row of pixel units to write data signals into the pixel units for display.

Each driving shift register unit is used for driving a row of pixel units of a display substrate. Polarity of a pixel unit is determined by the relative relationship between a voltage of a pixel electrode of the pixel unit and a common voltage during one frame of image display. When the voltage of the pixel electrode is greater than the common voltage, the pixel unit exhibits positive polarity. When the voltage of the pixel electrode is less than the common voltage, the pixel unit exhibits negative polarity. That polarity distribution of two rows of pixel units is the same means that polarity of two pixel units on any one column of the two rows of the pixel units is the same.

In one embodiment, a row of pixel units driven by the driving shift register unit of the m-th stage have the same polarity distribution as a row of pixel units driven by the driving shift register unit of the (m-N)-th stage.

FIGS. 2 (a) and (b) show a schematic view of polarity distribution of pixel units of two continuous frames in a dot inversion driving mode respectively. FIG. 2(a) represents the first or prior frame and FIG. 2(b) represents the second or later frame. The gate driving circuit according to one embodiment of the present invention is applicable to a display device of the dot inversion driving mode, which has excellent display effect. In this case, N can be 2. As shown in FIGS. 2(a) and (b), all odd-numbered rows of pixel units driven by driving shift register units of the odd-numbered stages respectively have the same polarity distribution in both frames. All even-numbered rows of pixel units driven by driving shift register units of the even-numbered stages respectively have the same polarity distribution in both frames. Of course, N can also be integers such as 4, 6, and 8. It should be noted that the present invention is not limited to the dot inversion driving mode in FIG. 2, and can also be used in other forms of inversion driving mode. For example, when an arbitrary fame age is displayed, polarity distribution of two adjacent pixel units of the same row is the same, and polarity distribution of a plurality of pixel units in the same column are " . . . +, +, −, −, +, +, . . . ". In this case, N may be 4, 8 or 12 etc. so that a row of pixel units driven by the driving shift register unit of the m-th stage have the same polarity distribution as a row of pixel units driven by the driving shift register unit of the (m-N)-th stage.

In one embodiment, the second input port IN2 of the driving shift register unit the m-th stage D_SR (m) and the first input port IN1 of the driving shift register unit of the (m-N)-th stage D_SR (m-N) are both connected with the output terminal OUT of the driving shift register unit of the (m-N-1)-th stage D_SR (m-N-1). Thus, when a first effective signal is outputted from the driving shift register unit of the (m-N-1)-th stage D_SR (m-N-1), the first input port IN1 of the driving shift register unit of the (m-N)-th stage D_SR (m-N) and the second input port IN2 of the driving shift register unit of the m-th stage D_SR (m) simultaneously receive an effective signal. As a result, the driving shift register unit of the (m-N)-th stage D_SR (m-N) outputs a first effective signal to turn on the (m-N)-th row of pixel units. Then, a source driving circuit writes data signals to the (m-N)-th row of pixel units, and the (m-N)-th row of pixel units are displayed. At the same time, the driving shift registering unit of the m-th stage D_SR (m) outputs a second effective signal to turn on the m-th row of pixel units so that the data signals written to the (m−N)-th row of pixel units are also written in the m-th row of the pixel units. This is equivalent to pre-charge the m-th mw of the pixel units. Since polarity distributions of the pixel units of the m-th row and the (m−N)-th row are the same, polarity of the signals of the pixel units on the m-th row at the time of pre-charging is the same as polarity of the signals that are subsequently written to the pixel units of the row for display. As such, reverse pre-charging does not occur here. Accordingly, occurrence of strips and the like can be reduced while speed of writing data signals for display is increased, thereby improving the display quality.

In driving shift register units of any two adjacent stages, a first input port IN1 of a driving shift register unit of the later stage is connected to an output terminal OUT of a driving shift register unit of a prior stage. The second input port IN2 of the driving shift register unit of the m-th stage is connected to the output terminal OUT of the driving shift register unit of the (m−N−1)-th stage. Thus, the second input port IN2 of the driving shift register unit of the m-th stage D_SRm is also connected to the first input port of the driving shift register unit of the (m−N)-th stage D_SR (m−N). m is an integer greater than N+1 and less than or equal to which is the total number of the driving shift register units.

In one embodiment, a plurality of start signal ports STVs may be added to provide an effective signal to the first input port IN1 of the driving shift register unit of the first stage D_SR1. Furthermore, the plurality of the start signal ports STVs may provide an effective signal to a second input port IN2 of driving shift register units of each of the $1^{st}$ to $N^{th}$ stages respectively. By adjusting timing of effective signals provided by the respective start signal ports STVs, a second input port IN2 may receive an effective signal earlier than a first input port IN1 at each stage of the driving shift register unit.

The timing of the effective signals provided by the respective start signal ports STVs can be determined by the number N of the driving shift register unit. Correspondingly, the time interval between the effective signal received by a second input port and that by a first input port of each stage of the driving shift register unit is also related to N. Taking N=2 as an example, a process of driving the gate driving circuit includes the following: in the first phase, an effective signal is provided to the second input port IN2 of the driving shift register unit of the first stage D_SR1. In the second phase, an effective signal is provided to the second input port IN2 of the driving shift register unit of the second stage D_SR2. In the third phase, an effective signal is provided to the first input port IN1 of the driving shift register unit of the first stage D_SR1, and the second input port IN2 of the driving shift register unit of the third stage D_SR3, respectively.

In one embodiment, as shown in FIG. 3, the gate driving circuit further comprises start shift register units of N stages connected in series such as S_SR1, S_SR2, N is the total number of start shift register units. In one embodiment. An input terminal of a start shift register unit of the first stage S_SR1 is connected to the start signal terminal STV. An input terminal of a start shift register unit of the p stage may be connected to an output terminal of a start shift register unit of the (p−1)-th stage. p may be an integer and 1<p≤N. As such, after the start signal terminal STV inputs a start signal, each stage of the start shift register units sequentially outputs an effective signal. The second input port IN2 of the driving shift register unit of the first stage D_SR1 is connected to the start signal terminal STV. The first input port IN1 of the driving shift register unit D_SR1 of the first stage is connected to the output terminal OUT of the start shift register unit of the N stage. In other words, the N stages of the start shift register units are arranged before the driving shift register units. The stage at which a start shift register unit is designated is determined by the order of the start shift register unit located in the N stages of start shift register units. It should be understood that the order of a start shift register unit is determined by the order of the start shift register unit located in the N stages of the start shift register units. The order of a driving shift register unit is determined by the order of the driving shift register unit located in all the driving shift register units.

In one embodiment, an input terminal of a start shift register unit of the first stage may be connected to the start signal terminal. A second input port of the driving shift register unit of the first stage may be connected to the start signal terminal. A first input port of the driving shift register unit of the first stage may be connected to an output terminal of the start shift register unit of the Nth stage. A second input port of the driving shift register unit of the q-th stage may be connected to an output terminal of the start shift register unit of the (q−1) stage. q may be an integer and 1<q≤N+1.

Figure 4:
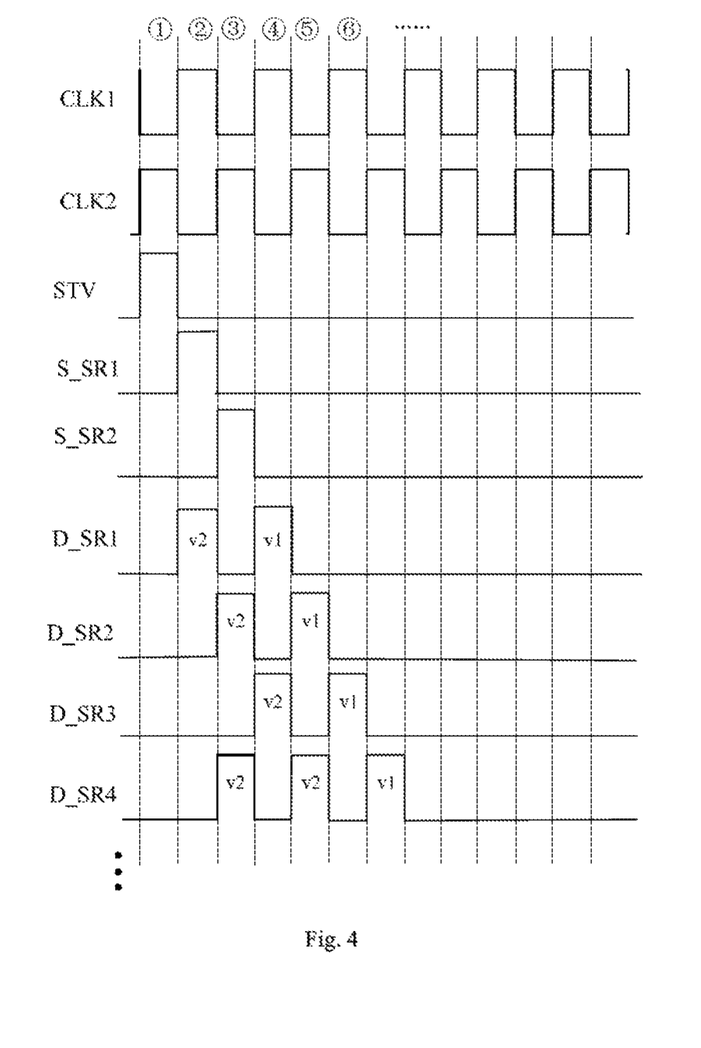
FIG. 4 is a signal timing diagram during operation of the gate driving circuit of FIG. 3 according to one embodiment of the present invention.

FIG. 4 shows a signal timing diagram during operation of the gate driving circuit of FIG. 3 according to one embodiment of the present invention. When driving the gate driving circuit, it is only necessary to provide a start signal to the start signal terminal STV in the first phase. Specifically, in the case of N=2, as shown in FIG. 4, after the start signal terminal STV receives a start signal in the first phase, the start shift register unit S_SR1 of the first stage outputs an effective signal in the second phase. The start shift register unit S_SR2 of the second stage outputs an effective signal in the third phase. As such, the second input port IN2 of the driving shift register unit of the second stage D_SR2 receives an effective signal in the second phase. The first input port IN1 of the driving shift register unit of the first stage D_SR1 and the second input port IN2 of the driving shift register unit of the third stage D_SR3 receive an effective signal respectively in the third phase. Thus, the driving shift register unit of the first stage D_SR1 outputs an effective signal, which is a second effective signal v2, in the second phase, and outputs another effective signal, which is a first effective signal v1, at the fourth phase.

For the driving shift register unit of the second stage D_SR2, the second input port IN2 receives an effective signal outputted from the start shift register unit of the first stage S_SR1 in the second phase, and the first input port receives the first effective signal outputted from the driving shift register unit of the first stage D_SR1 in the fourth phase. Thus, the driving shift register unit of the second stage D_SR2 outputs an effective signal, which is a second effective signal v2, in the third phase, and outputs an effective signal, which is a first effective signal v1, in the fifth stage.

For the driving shift register unit of the third stage D_SR3, the second input port IN2 receives an effective signal outputted horn the start shift register unit of the second stage S_SR2 in the third phase, and the first input port IN1 receives the first effective signal outputted from the driving shift register unit of the second stage D_SR2 in the fifth phase. Thus, the driving shift register unit of the third stage outputs an effective signal, which is a second significant signal v2, in the fourth phase, and outputs another effective signal, which is a first effective signal v1, in the sixth phase.

For the driving shift register unit of the fourth stage D_SR4, the second input port IN2 receives an effective signal outputted from the driving shift register unit of the first stage D_SR1 in the second and fourth phases respectively. The first input port IN1 receives the first effective signal outputted from the driving shift register unit of the third stage D_SR3 in the sixth phase. Therefore, the driving shift register unit of the fourth stage D_SR4 outputs two effective signals, which are the second effective signals v2, in the third and fifth phases respectively, and outputs another effective signal, which is the first effective signal v1, in the seventh phase. Likewise, hereafter, each stage of the driving shift register unit outputs three effective signals, wherein the first two are second effective signals and the third is a first effective signal. That is, pixel units of the corresponding rows are pre-charged twice before the display, and polarity of the signals written to the pixel units timing these, two pre-charge is the same.

The gate driving circuit may also be applied to a display device of another dot inversion mode. That is, N is another integer. The driving principle is similar to that when N=2, and is not repeatedly described here.

As described above, when the display device employs the dot inversion driving mode as shown in FIG. 2, that is, polarity of two adjacent pixel units in any column is opposite. As such, N can be 2, 4, 6, or other quantities.

For the dot inversion drive mode in FIG. 2, the interval between the timing at which a second effective signal is received and the timing at which a first effective signal is received by a pixel unit is relatively short. That is, after the pixel unit receives the corresponding data signal in the pre-charge phase, it takes only a short time to receive the data signal for display.

The shift register unit may further comprise a reset terminal Reset. The shift register unit here maybe a driving shift register unit or a start shill register unit. The shift register unit is used for outputting an ineffective signal when it receives an effective signal at the reset terminal Reset. As shown in FIG. 3, in start shift register units of any two adjacent stages, the reset terminal Reset of the start shift register unit of the lower stage is connected with the output terminal of the start shift register unit of the higher stage. The reset terminal Reset of the start shift register unit of the last stage is connected to the output terminal OUT of the driving shift register unit of the first stage D_SR1. For driving shift register units of any two adjacent stages, the reset terminal of the driving shift register unit of the lower stage is connected to the output terminal OUT of the driving shift register unit of the higher stage. As such, after the driving shift register unit of each stage outputs a first effective signal to display the corresponding row of pixel units, it does not output any effective signals any more. Accordingly, the display of the corresponding row of pixel units is not affected when data signals are written into the next row of pixel units for display.

Figure 5:
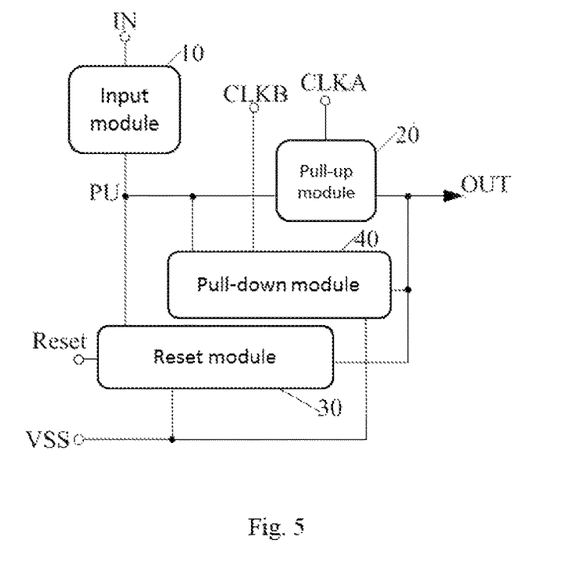
FIG. 5 is a block diagram of a module structure of a shift register unit according to one embodiment of the present invention.

FIG. 5 shows a block diagram of a module structure of a shift register unit according to one embodiment of the present invention. The shift register unit here maybe a driving shift register unit or a start shift register unit. As shown in FIG. 5, the shift register unit further includes a first clock signal CLKA, a second clock signal CLKB, an ineffective signal terminal VSS, an input module 10, a pull-up module 20, a reset module 30, and a pull-down module 40.

The input module 10 is connected to the input terminal IN of the shift register unit and the pull-up node PU respectively. The input module 10 is used for providing an effective signal to the pull-up node PU when an effective signal is received at the input terminal IN. The pull-up node PU is a connection node of the input module 10 and the pull-up module 20. In the driving shift register unit, that the input module 10 is connected to the input terminal IN means that the input module is connected to both the first input port IN1 and the second input port IN2. When at least one of the first input port IN1 and the second input port IN2 receives an effective signal, it can be regarded that the input terminal IN of the driving shift register unit receives an effective signal.

The pull-up module 20 is connected to the pull-up node PU, the first clock signal terminal CLKA, and the output terminal OUT of the shift register unit, respectively. The pull-up module 20 is used for electrically connecting the first clock signal CLKA and the output terminal OUT when the pull-up node PU receives an effective signal.

The reset module 30 is connected to the reset terminal Reset, the pull-up node PU, the output terminal OUT, and the ineffective signal terminal VSS, respectively. The reset module 30 is used for electrically connecting the output terminal OUT of the shift register unit and the pull-up node PU to the ineffective signal terminal VSS respectively when the reset terminal Reset receives an effective signal. The speed at which the reset module 30 electrically connects the pull-up node PU and the ineffective signal terminal VSS should be smaller than the speed at which the input module 30 provides an effective signal to the pull-up node PU when the input terminal IN receives an effective signal. This is to ensure that in the driving shift register unit, when one or both of the first input port IN1 and the second input port IN2 receive an effective signal and the reset terminal Reset receives an effective signal, the pull-up node PU can still be at an effective potential.

The pull-down module 40 is connected to the second clock signal terminal CLKB, the pull-up node PU, and the output terminal OUT of the shift register unit, respectively. The pull-down module 40 is used for electrically connecting the pull-up node PU and the output terminal OUT to the ineffective signal terminal VSS respectively when the second clock signal CLKB receives an effective signal. The speed at which the pull-down module 40 electrically connects the pull-up node PU to the ineffective signal tut urinal VSS should be less than the speed at which the input module 30 provides an effective signal to the pull-up node PU when the input terminal IN receives an effective signal. This is to ensure that the pull-up node PU can reach an effective potential when both the second clock signal terminal CLKB and the input terminal IN of the shift register unit receive an effective signal.

Figure 6:
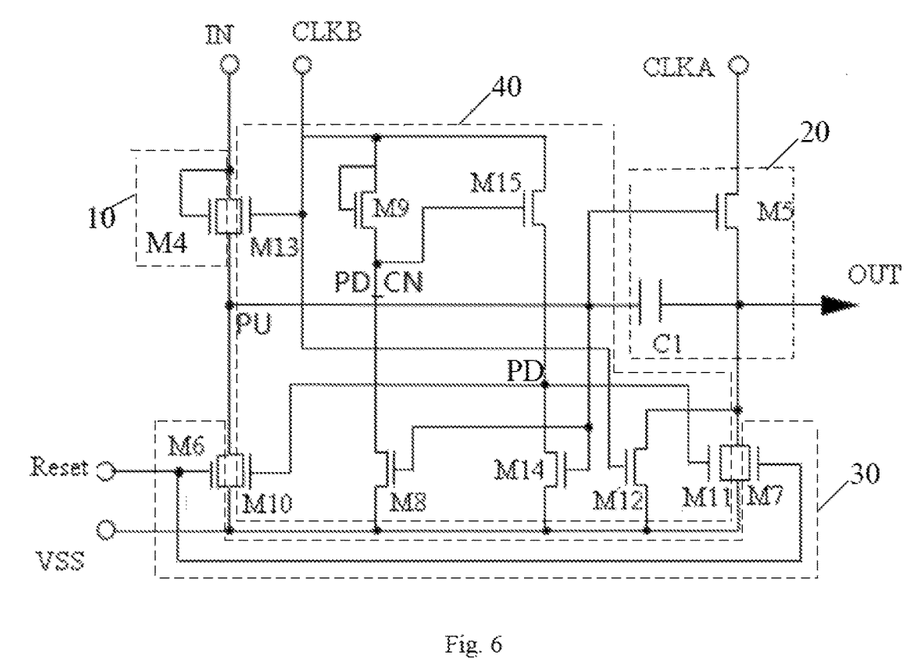
FIG. 6 is a schematic structural diagram of a start shift register unit according to one embodiment of the present invention.
Figure 8:
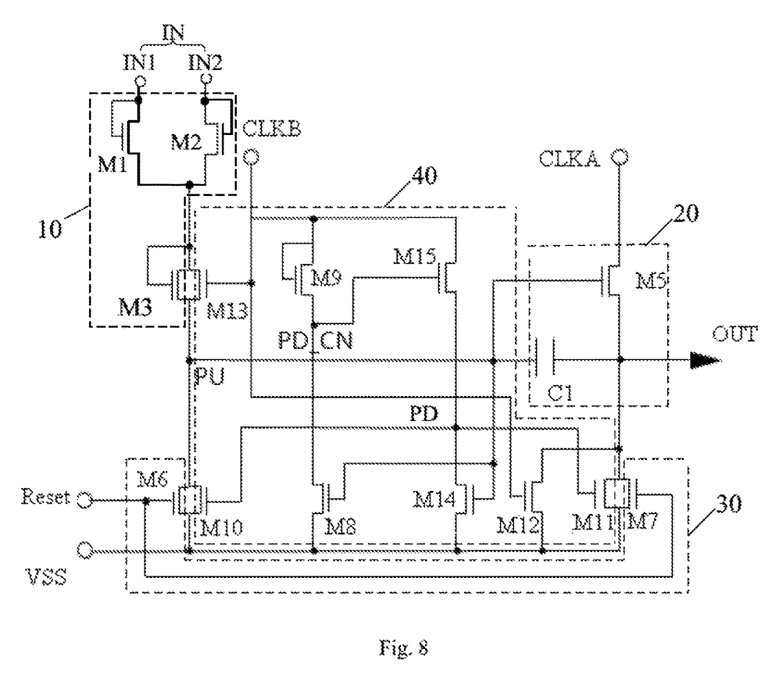
FIG. 8 is a schematic structural diagram of a driving shift register unit according to one embodiment of the present invention.

FIG. 6 shows a schematic structural view of a start shift register unit according to one embodiment of the present invention. FIG. 8 shows a schematic structural view of a driving shift register unit according to one embodiment of the present invention. As shown in FIG. 6, the input module 10 of the start shift register unit includes a fourth transistor M4. The gate and the first terminal of the fourth transistor M4 are connected to the input terminal IN of the start shift register unit. The second terminal of the fourth transistor M4 is connected to the pull-up node PU of the start shift register unit.

As shown in FIG. 8, the input module 10 of the driving shift register unit includes a first transistor M1, a second transistor M2, and a third transistor M3. The gate and the first terminal of the first transistor M1 are connected to the first input port IN1 respectively. The gate and the first terminal of the second transistor M2 are connected to the second input port IN2 respectively. The second terminal of the first transistor M1 is connected to the second terminal of the second transistor M2. The first terminal and the gate of the third transistor M3 is connected to the second terminal of the second transistor M2 respectively. The second terminal of the third transistor M3 is connected to the pull-up node PU of the driving shift register unit.

As shown in FIG. 6 and FIG. 8, the pull-up module 20 includes a fifth transistor M5 and a storage capacitor C1. The first terminal of the storage capacitor C1 is connected to the pull-up node PU of the shift register unit. The second terminal of the storage capacitor C1 is connected to the output terminal OUT of the shift register unit. The gate of the fifth transistor M5 is connected to the first terminal of the storage capacitor C1. The first terminal of the fifth transistor M5 is connected to the first clock signal terminal CLKA. The second terminal of the fifth transistor M5 is connected to the output terminal OUT of the shift register unit.

As shown in FIG. 6 and FIG. 8, the reset module 30 includes a sixth transistor M6 and a seventh transistor M7. The gate of the sixth transistor M6 and the gate of the seventh transistor M7 are connected to the reset terminal Reset respectively. The first terminal of the sixth transistor M6 is connected to the pull-up node PU. The first terminal of the seventh transistor is connected to the corresponding output terminal. The second terminal of the sixth transistor M6 and the second terminal of the seventh transistor M7 are connected to the ineffective signal terminal VSS respectively. When the reset terminal receives an effective signal, the sixth transistor and the seventh transistor are turned on, so that the pull-up node and the output terminal of the shift register unit are electrically connected to the ineffective signal terminal respectively. The width-length ratio of the sixth transistor, the tenth transistor, the third transistor, and the thirteenth transistor should satisfy that when the input terminal receives an effective electrical potential and the four transistors are turned on at the same time, the speed at which the pull-up node receives the effective electrical potential should be greater than the speed at which the pull-up node is electrically connected with the ineffective signal.

As shown in FIG. 6 and FIG. 8, the pull-down module 40 includes an eighth transistor M8, a ninth transistor M9, a tenth transistor M10, an eleventh transistor M11, a twelfth transistor M12, a thirteenth transistor M13, a fourteenth transistor M14, and a fifteenth transistor M15. The gate of the thirteenth transistor M13 is connected to the second clock signal terminal CLKB. The first terminal of the thirteenth transistor M13 is connected to the input terminal IN of the shift register unit. The second terminal of the thirteenth transistor M13 is connected to the pull-up node PU. The gate and the first terminal of the ninth transistor M9 are connected to the second clock signal CLKB respectively. The second terminal of the ninth transistor M9 is connected to the gate of the fifteenth transistor M15, and the connection node thereof forms the pull-down control node PD_CN. The first, terminal of the fifteenth transistor M15 is connected to the second dock signal CLKB. The second terminal of the fifteenth transistor M15 is connected to the first terminal of the fourteenth transistor M14, and the connection node thereof forms the pull-down node PD. The gate of the fourteenth transistor M14 is connected to the pull-up node PU. The second terminal of the fourteenth transistor M14 is connected to the ineffective signal terminal VSS. The gate of the eighth transistor M8 is connected to the pull-up node PU. The first terminal of the eighth transistor M8 is connected to the gate of the fifth transistor M5. The second terminal of the eighth transistor M8 is connected to the ineffective signal terminal VSS. The gate of the tenth transistor M10 and the gate of the eleventh transistor M11 are connected to the second terminal of the fifteenth transistor M15 respectively. The second terminal of the tenth transistor M10 and the second terminal of the eleventh transistor M11 are both connected to the ineffective signal terminal VSS respectively. The first terminal of the tenth transistor M10 is connected to the pull-up node PU. The first terminal of the eleventh transistor M11 is connected to the output terminal OUT of the shift register unit. The gate of the twelfth transistor M12 is connected to the second clock signal terminal CLKB. The first terminal of the twelfth transistor M12 is connected to the output terminal OUT of the shift register unit. The second terminal of the twelfth transistor M12 is connected to the ineffective signal terminal VSS.

In one embodiment, each of the transistors is an N-type thin film transistor. Accordingly, the effective signal is a high-level signal, and the ineffective signal is a low-level signal. In another embodiment, each of the transistors may be a P-type thin film transistor. Accordingly, the effective signal is a low level signal, and the ineffective signal a high level signal.

Figure 7:
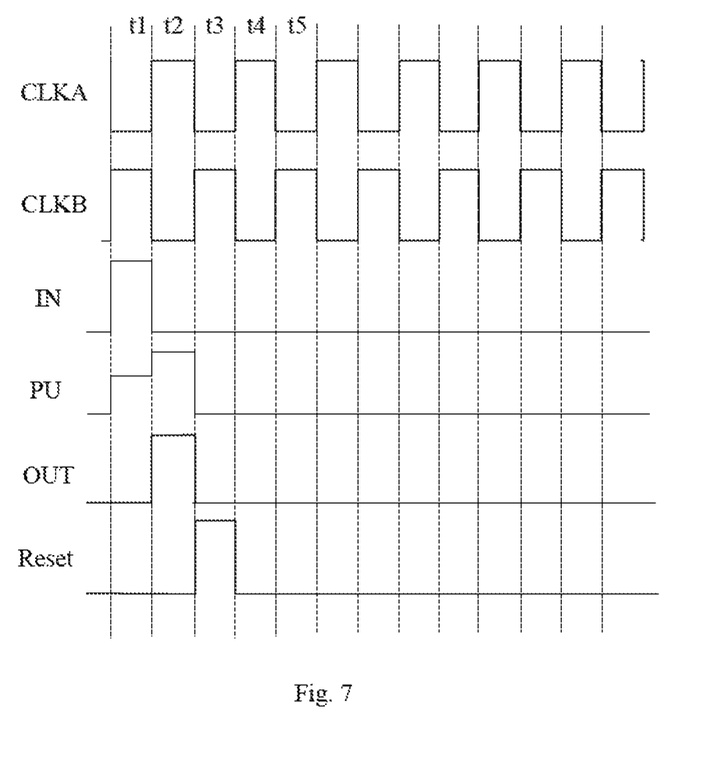
FIG. 7 is a signal timing diagram in operation of a start shift register unit according to one embodiment of the present invention.

FIG. 7 shows a signal timing diagram in operation of the start shift register unit of FIG. 6 according to one embodiment of the present invention. The operation of the start shift register unit will be described below with reference to FIG. 6 and FIG. 7. Each transistor is an N-type thin film transistor and the effective signal is a high level signal. In the t1 phase, the input terminal IN is inputted an effective signal. The first clock signal terminal CLKA is inputted an ineffective signal. At this time, the fourth transistor M4 is turned on and the pull-up node PU receives an effective signal. At the same time, the eighth transistor M8 and the fourteenth transistor M14 are turned on, so that the pull-down control node PD_CN and the pull-down node PD receive an ineffective signal respectively. Furthermore, the fifth transistor M5 is turned on so that the first clock signal terminal CLKA and the output terminal OUT are electrically connected. The output terminal OUT outputs an ineffective signal.

In the t2 phase, the input terminal IN is inputted an ineffective signal. The first clock signal terminal CLKA is inputted an effective signal. The second clock signal terminal CLKB is inputted an ineffective signal. At this time, the fourth transistor M4 is turned off. The potential of the pull-up node PU is further raised by a bootstrap action of the storage capacitor C1, so that the fifth transistor M5 is turned on. As such, the first clock signal terminal CLKA is electrically connected with the output terminal OUT. The output terminal OUT outputs an effective signal.

In the t3 phase, the reset terminal Reset is inputted an effective signal, the first clock signal terminal CLKA is inputted an ineffective signal, and the second clock signal terminal CLKB is inputted an effective signal. At this time, the twelfth transistor M12 is turned on so that the output terminal OUT and the ineffective signal terminal VSS are electrically connected. At the same time, the sixth transistor M6 and the seventh transistor M7 are turned on so that both the pull-up node PU and the output terminal OUT are electrically connected with the ineffective signal terminal respectively. At the same time, the ninth transistor M9, the thirteenth transistor M13, and the fifteenth transistor M15 are turned on. The pull-down node PD receives an effective signal so that the tenth transistor M10 and the eleventh transistor M11 are turned on. The pull-up node PU and the output terminal OUT may also be electrically connected with the ineffective signal terminal VSS respectively. The output terminal OUT outputs an ineffective signal.

In the t4 phase, the first clock signal terminal CLKA is inputted an effective signal. The second clock signal terminal CLKB and the input terminal IN are inputted an ineffective signal respectively. At this time, the fourth transistor M4, the ninth transistor M9, and the fifteenth transistor M15 are turned off, but the fourteenth transistor M14, the eleventh transistor M11, and the tenth transistor M10 leak current. As such, the pull-down node PD and the ineffective signal terminal are electrically connected. At the same time, the pull-up node PU and the output terminal OUT maintain the ineffective potential.

In the t5 phase, the first clock signal terminal CLKA is inputted an ineffective signal and the second clock signal terminal CLKB is inputted an effective signal. At this time, the twelfth transistor M12, the thirteenth transistor M13, the ninth transistor M9, and the fifteenth transistor M15 are turned on. The pull-down node PD receives an effective signal so that both the pull-up node PU and the output terminal OUT are electrically connected with the ineffective signal terminal VSS. Then, the t4 and the t5 phases are repeated, and the output terminal OUT continues to output a low level until the input terminal IN is inputted an effective signal again.

Figure 9:
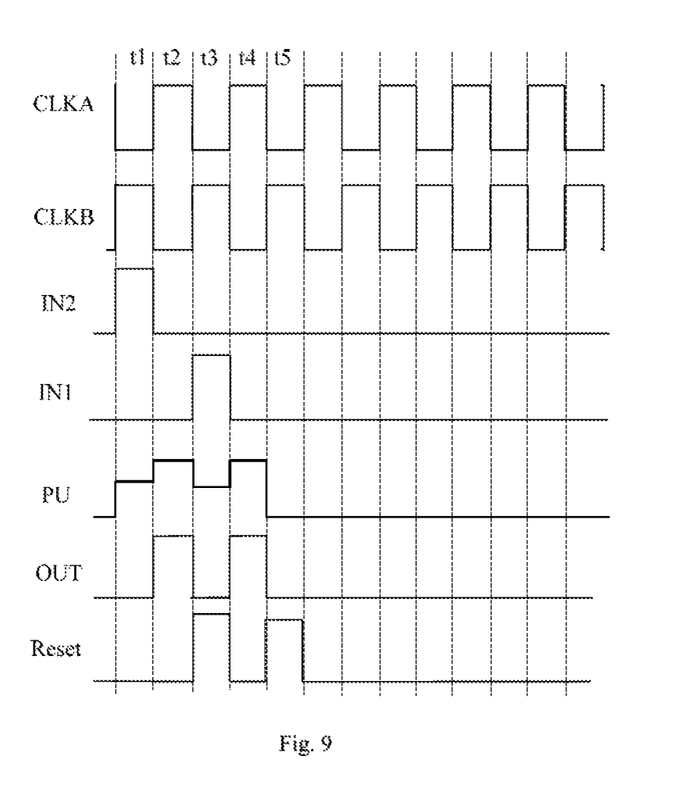
FIG. 9 is a signal timing diagram in operation of a driving shift register according to one embodiment of the present invention.

FIG. 9 is a signal timing diagram in operation of the driving shift register of FIG. 8 according to one embodiment of the present invention. The difference between the operation of the driving shift register unit and that of the start shift register is that the input terminal IN of the driving shift register unit receives an effective signal at least twice and the output terminal OUT of the driving shift register unit outputs at least two effective signals. Take the effective signal being received at least twice at the input terminal IN of the driving shift register unit as an example, as shown in FIG. 9, in the t1 phase, at least one of the first input port IN1 and the second input port IN2 is inputted with an effective signal, so that at least one of the first transistor M1 and the second transistor M2 is turned on. As a result, the third transistor M3 is turned on and the pull-up node PU receives an effective signal. The states of the remaining transistors are the same as those in the start shift register unit in the t1 phase, in the t2 phase, the first transistor M1 and the second transistor M2 are turned off and the states of the remaining transistors and the potential of each node are the same as those in the start shift register unit in the t2 phase. In the t3 phase, at least one of the first input port IN1 and the second input port IN2 is inputted with an effective signal, so that at least one of the first transistor M1 and the second transistor M2 is turned on. As a result, the third transistor M3 is turned on. The pull-up node PU receives an effective potential. At the same time, the reset terminal Reset is inputted an effective signal so that the pull-up node PU and the output terminal OUT are electrically connected to the ineffective signal terminal VSS respectively. Further, the speed at which the pull-up node PU and the ineffective signal terminal VSS are electrically connected is smaller than the speed at which the pull-up node PU receives the effective signal, so that the pull-up node PU in the t3 phase can reach the effective potential, and the output terminal OUT outputs an ineffective signal. In the t4 phase, similar to the t2 phase, the output terminal OUT outputs an effective signal. After the t4 phase, the first transistor M1 and the second transistor M2 of the driving shift register unit remain off. The states of the remaining transistors are the same as those in the start shift register unit after the t3 phase. As such, the driving shift register unit continues to output an ineffective signal after the t4 phase until an effective signal is inputted again to the input terminal IN. Of course, the input terminal IN of the shift register unit can also receive an effective signal three times. In this case, the timings of signals are similar to those in FIG. 9 except that the output terminal OUT outputs three effective signals accordingly.

Further, as shown in FIG. 3, in order to facilitate provision of signals to the first clock signal terminal CLKA and the second clock signal terminal CLKB of each of the shift a registering units, the gate driving circuit further includes a first clock supply terminal CLK1 and a second clock supply terminal CLK2. The first clock supply terminal CLK1 and the second clock supply terminal CLK2 are used for providing clock signals with opposite phases. The first clock signal terminals CLKA of the start shift register units of the odd-numbered stages and of the driving shift register units of the odd-numbered stages are connected to the first clock supply terminal CLK1. The second clock signal terminals CLKB of the start shift register units of the odd-numbered stages and of the driving shift register units of the odd-numbered stages are connected to the second clock supply terminal CLK2. The first clock signal terminals CLKA of the start shift register units of the even-numbered stages and of the driving shift register units of the even-numbered stages are connected to the second clock supply terminal CLK2. The second clock signal CLKB of the start shift register units of the even-numbered stages and of the driving shift register units of the even-numbered stages are connected to the first clock supply terminal CLK1. Of course, the gate driving circuit may also include an ineffective signal supply terminal VSS' for providing an ineffective signal. The ineffective signal supply terminal VSS' may be connected to the ineffective signal terminal VSS of each shift register unit.

Another example of the present invention is a driving method of the gate driving circuit according to one embodiment of the present invention. The driving method comprises the following driving steps at each cycle of display:

An effective signal is sequentially provided to the second input port IN2 of driving shift register units of theist to N-th stages respectively. Then, an effective signal is simultaneously provided to the first input port of the driving shift register unit of the first stage and the second input port of the driving shift register unit of the (N+1)-th stage respectively.

As described above, the effective signal outputted when the driving shift register unit receives an effective signal at its second input port is referred to as the second effective signal. And the effective signal outputted when the first input port receives the effective signal and the second input port does not receive the effective signal is referred to as the first effective signal. Then, each stage of the driving shift register unit outputs a second effective signal earlier than a first effective signal. In addition, the second input port of the driving shift register unit of the m-th stage and the first input port of the driving shift register unit of the (m−N)-th stage are both connected to the output terminal of the driving shift register unit of the (m−N−1)th stage. Thus, when the driving shift register unit of the (m−N−1)-th stage outputs the first effective signal, the first input port of the driving shift register unit of the (m−N)-th stage and the second input port of the driving shift register unit of the m-th stage simultaneously receive an effective signal. As a result, the driving shift register unit of the (m−N)-th stage outputs a first effective signal to turn on the pixel units of the (m−N)-th row. At this time, the source driving circuit can write data to the pixel units of the (m−N)-th row, so that the pixel units of the (m−N)-th row is displayed. At the same time, the driving shift register unit of the m-th stage outputs a second effective signal to turn on pixel units of the m-th row. As such, the data signals which are written to the pixel units of the (m−N)-th row are also written in the pixel units of the m-th row, thereby pre-charging the pixel units of the m-th row. Since polarity distribution of the pixel units of the m-th row and of the (m−N)-th row is the same, therefore, the signals on the pixel units of the m-th row at the time of pre-charging have the same polarity as the signals which are later written to the pixel units of the m-th row for display. Thus, reverse pre-charging does not occur here, and the display effect can be guaranteed while the speed of writing data signals is increased.

In another embodiment, the gate driving circuit includes a start signal terminal, a first clock supply terminal, and a second clock supply terminal. The shift register unit includes a first clock signal terminal and a second clock signal terminal. The plurality of the shift register units further comprise N stages of the start shift register units connected in series. The driving method of the gate driving circuit includes the followings.

Two clock signals having opposite phases are provided to the first clock supply terminal and the second clock supply terminal, respectively. At the initial phase, a start signal is provided to the start signal terminal. Polarity of each of the clock signals in two adjacent phases are opposite. The clock signal of the first clock supply terminal is an ineffective signal at the initial phase. As such, an effective signal is provided sequentially to the second input ports of driving shift register units of the 1st to N-th stages. Furthermore, the first input port. IN1 of the driving shift register unit of the first stage and the second input port IN2 of the driving shift register unit of the (N+1)-th stage receive an effective signal simultaneously after the second input port IN2 of the driving shift register unit of the Nth stage receives an effective signal.

In one embodiment, for the dot inversion driving method as in FIG. 2, the gate driving circuit has the structure shown in FIG. 3, that is, N=2. The operation principle of the gate driving circuit in FIG. 3 will be described in detail in the following part based on the operation principle of the start shift register unit and the driving shift register unit.

As shown in FIG. 4, in the first phase, which is the initial phase, the start signal terminal STV provides an effective signal. For the start shift register unit of the first stage S_SR1, its input terminal IN receive an effective signal in the second phase so that the pull-up node PU receives an effective signal. In the second phase, the first clock signal terminal CLKA of the start shift register unit of the first stage S_SR1 receives the effective signal provided by the first clock supply terminal CLK1. At the same time, the pull-up module 20 electrically connects the output a terminal OUT to the first clock signal CLKA due to the effective potential at the pull-up node PU. As a result, the output terminal OUT outputs an effective signal. After the second phase, the start shift register unit of the first stage S_SR1 continues to output an ineffective signal until the next cycle of display.

For the start shift register unit of the second stage S_SR2, in the second phase, the input terminal IN of the start shift register unit of the second stage S_SR2 receives the effective signal outputted from the start shift register unit S_SR1 of the first stage so that the pull-up node PU of S_SR2 receives an effective signal. In the third phase, the first clock signal terminal CLKA of the start shift register unit of the second stage S_SR2 receives the effective signal provided by the second clock supply terminal CLK2. At the same time, the output terminal OUT is electrically connected to the first clock signal terminal CLKA and accordingly outputs an effective signal. After the third phase, the start shift register unit S_SR2 of the second stage continues to output the ineffective signal until the next cycle of display.

For the driving shift register unit D_SR1 of the first stage, in the first phase, the second input port 1142 of the driving shift register unit of the first stage D_SR1 receives the effective signal of the start signal terminal STV, so that the pull-up node PU of the driving shift register unit D_SR1 of the first stage receives an effective signal. In the second phase, the first clock signal terminal CLKA of the driving shift register unit of the first stage D_SR1 receives the effective signal provided by the first clock supply terminal CLK1. At the same time, the pull-up module 20 electrically connects the output terminal OUT to the first clock signal CLKA due to the effective potential at the pull-up node PU so that the output terminal OUT outputs an effective signal, which is a second effective signal. In the third phase, the first input port IN1 of the driving shift registering unit of the first stage D_SR1 receives the effective signal outputted from the start shift register unit S_SR2 of the second stage, so that the pull-up node PU of the driving shift register unit of the first stage receives an effective signal again. At the same time, the reset terminal and the pull-dower node PD of the driving shift register unit of the first stage D_SR1 receive an effective signal, so that the driving shift register unit of the first stage D_SR1 outputs an ineffective signal. In the fourth phase, the first clock signal terminal CLKA of the driving shift register unit of the first stage D_SR1 receives the effective signal provided by the first clock supply terminal CLK1. At the same time, the pull-up module 20 electrically connects the output terminal OUT to the first clock signal CLKA due to the effective potential at the pull-up node PU. As a result, the output terminal OUT outputs an effective signal, which is a first effective signal. After the fourth phase, the pull-down node PD of the driving shift register unit of the first stage D_SR1 is alternately at an effective potential and an ineffective potential. The pull-up node PU and the output terminal OUT no longer receive an effective signal. As a result, the output terminal OUT continues to output an ineffective signal until the next cycle of display.

For the driving shift register unit of the second stage D_SR2, in the second phase, the second input port IN2 of the driving shift registering unit of the second stage D_SR2 receives the effective signal outputted from the start shift register unit of the first stage S_SR1 so that the pull-up node PU of the driving shift register unit of the second stage D_SR2 receives an effective signal. In the third phase, the first clock signal terminal CLKA of the driving shift register unit of the second stage D_SR2 receives the effective signal provided by the second clock supply terminal CLK2. At the same time, the pull-up module 20 electrically connects the output terminal OUT to the first clock signal CLKA due to the effective potential at the pull-up node PU. As a result, the output terminal OUT outputs an effective signal, which is a second effective signal. In the fourth phase, the first input port IN1 of the driving shift register unit of the second stage D_SR2 receives the first effective signal outputted from the driving shift register unit of the first stage D_SR1, so that the pull-up node PU of the driving shift register unit of the second stage D_SR2 receives an effective signal again. In the fifth phase, the first clock signal terminal CLKA of the driving shift register unit of the second stage receives an effective signal. The pull-up module 20 electrically connects the output terminal OUT to the first clock signal CLKA. As a result, the output terminal OUT outputs an effective signal, which is a first effective signal. After the fifth phase, the output terminal OUT of the driving shift register unit of the second stage D_SR2 continues to output an ineffective signal until the next cycle of display.

For the driving shift register unit of the third stage, in the third phase, the second input port IN2 of the driving shift register unit of the third stage D_SR3 receives the second effective signal outputted from the start shift mister unit of the second stage S_SR2, so that the pull-up node PU of the driving shift register unit of the third stage D_SR3 receives an effective signal. In the fourth phase, the first clock signal terminal CLKA of the driving shift register unit of the third stage D_SR3 receives an effective signal provided by the first clock supply terminal CLK1. At the same time, the pull-up module 20 electrically connects the output terminal OUT to d the first clock signal CLKA due to the effective potential at the pull-up node PU. As a result, the output terminal OUT outputs an effective signal, which is a second effective signal. In the fifth phase, the first input port IN2 of the driving shift register unit of the third stage D_SR3 receives the first effective signal outputted from the driving shift register unit of the second stage D_SR2, so that the pull-up node PU of the driving shift register unit of the third stage D_SR3 receives an effective signal again. In the sixth phase, the first clock signal CLKA of the driving shift register unit of the third stage D_SR3 receives the effective signal provided by the first clock supply terminal CLK1. At the same time, the pull-up module 20 electrically connects the output terminal OUT to the first clock signal CLKA due to the effective potential at the pull-up node PU. As a result, the output terminal OUT outputs an effective signal. After the sixth phase, the output terminal OUT of the driving shift register unit of the third stage D_SR3 continues to output an ineffective signal until the next cycle of display.

For the driving shift register unit of the fourth stage D_SR4, in the second phase and the fourth phase, the second input port IN2 of the driving shift register unit of the fourth stage D_SR4 receives the second effective signal and the first effective signal outputted from the driving shift register unit of the first stage D_SR1 respectively. Similar to the driving shift register unit of the second stage D_SR2, the driving shift register unit of the fourth stage outputs two effective signals in the third and fifth phases respectively. The two effective signals are both outputted after the second input port IN2 of the driving shift register unit of the fourth stage D_SR4 receives the effective signal and accordingly regarded as the second effective signals. In the sixth phase, the first input port IN1 of the driving shift register unit of the fourth stage D_SR4 receives the first effective signal outputted from the driving shift register unit of the third stage D_SR3, so that the pull-up node PU receives an effective signal for the third time. In the seventh phase, the first clock signal terminal CLKA of the driving shift register unit of the fourth stage D_SR4 receives the effective signal provided by the second clock supply terminal CLK2. At the same time, the pull-up module 20 electrically connects the output terminal OUT to the first dock signal CLKA due to the effective potential at the pull-up node PU. As a result, the output terminal OUT outputs an effective signal, which is a first effective signal. After that, the output terminal OUT of the driving shift register unit of the fourth stage D_SR4 continues to output an inflective signal until the next cycle of display.

Likewise, each of the driving shift register units of the fifth and later stages outputs three effective signals. Among the three effective signals, the first two effective signals can be regarded as second effective signals and the third effective signal can be regarded as a first effective signal.

It can be seen that when the driving shift register unit of the third stage outputs a second driving signal to pre-charge the pixel units of the third row, the driving shift register unit of the first stage outputs a first driving signal to write data signals to the pixel units of the first row for display. The signals received by the pixel units of the third row for pre-charging are the same as the signals received by the pixel units of the first row for display, and polarity distributions of the first and third rows of pixel units are the same. Therefore, the pixel units of the third row can be pre-charged before the display, thereby increasing the speed of writing signals during the display. Similarly, for each of the driving shift register units of the fourth and subsequent stages, when each second effective signal is outputted, the corresponding row of pixel units is pre-charged. Furthermore, polarity of the signals written to the pixel units of a row at the time of pre-Charge is the same as that of the signals required for the same row to be displayed later, thereby increasing the speed of writing signals during the display.

Another example of the present invention is a display substrate. The display substrate comprises a plurality of rows of pixel units and the gate driving circuit according to one embodiment of the present invention. Each of the driving shift register units of the gate driving circuit, corresponds with one of the plurality of rows of the pixel units. Specifically, a plurality of gate lines and a plurality of data lines are provided on a base substrate of the display substrate. The plurality of gate lines and the plurality of data lines intersect with each other to define a plurality of pixel units. The gate driving circuit may be disposed on the base substrate, and the output terminal of each of the shift register units is connected to the gate line of the corresponding row of pixels.

Another example of the present invention is a display device. The display device includes a display substrate according to one embodiment of the present invention. In the gate driving circuit, when the driving shift register unit of the (m−N)-th stage outputs a first effective signal, the driving shift register unit of the m-th stage outputs a second effective signal. Therefore, when the (m−N)-th row of pixel units is displayed, the m-th row of pixel units can be pre-charged, thereby improving the writing speed of signals for the m-th row of pixel units during display. This facilitates production of a display device having a large size and a high resolution. Furthermore, because polarity distributions of the pixel units of the m-th row and the (m−N)-th row are the same, the polarity of the signals of the m-th row of pixel units at the time of pre-charging is the same as the polarity of the signals of the row of pixel units written subsequently for display. Therefore, reverse pre-charging does not occur, and the display effect can be ensured while writing speed the data signals is increased.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

A list of abbreviation in the present application is shown:
S_SR1, S_S2: Start shift register
D_SR1 to D_SR4: Driving shift register IN: input terminal
IN1: first input terminal
IN2: second input terminal
OUT: output terminal
CLKA: first clock signal terminal
CLKB: second clock signal terminal
CLK1: first clock supply terminal
CLK2: second clock supply terminal
Reset: reset terminal
VSS: ineffective signal terminal
STV: start signal terminal
10: input module
20: pull-up module
30: reset module
40: pull-down module
M1~M15: first transistor to fifteenth transistor
PU: pull-up node
PD: pull-don node
PD_CN: pull-down control node.

What is claimed is:

1. A gate driving circuit comprising:
   x stages of driving shift register units connected in series, each of the driving shift register units comprising an input terminal, an output terminal, and a reset terminal, the input terminal comprising a first input port and a second input port, and
   N stages of start shift register units connected in series,
   wherein a first input port of a driving shift register unit of the m-th stage is connected to an output terminal of a driving shift register unit of the (m−1)-th stage, and a second input port of the driving shift register unit of the m-th stage is connected to an output terminal of a driving shift register unit of the (m−N−1)-th stage, wherein N is an integer greater than 1, x is an integer, m is an integer, and $N+1 < m \leq x$, and
   an input terminal of a start shift register unit of the p stage is connected to an output terminal of a start shift register unit of the (p−1)-th stage, wherein p is an integer and $1 < p \leq N$.

2. The gate driving circuit according to claim 1, wherein a row of pixel units driven by the driving shift register unit of the m-th stage have the same polarity distribution as a row of pixel units driven by a driving shift register unit of the (m−N)-th stage.

3. The gate driving circuit according to claim 1, wherein N is 2.

4. The gate driving circuit according to claim 1, further comprising a start signal terminal,
   wherein an input terminal of a start shift register unit of the first stage is connected to the start signal terminal, a second input port of a driving shift register unit of the first stage is connected to the start signal terminal, a first input port of the driving shift register unit of the first stage is connected to an output terminal of a start shift register unit of the Nth stage, a second input port of a driving shift register unit of the q-th stage is connected to an output terminal of a start shift register unit of the (q−1) stage, wherein q is an integer and $1 < q \leq N+1$.

5. The gate driving circuit according to claim 4, wherein an output terminal of the start shift register unit of the p stage is connected to a reset terminal of the start shift register unit of the (p−1)-th stage, a reset terminal of the start shift register unit of the N stage is connected to an output terminal of a driving shift register unit of the first stage, and
   wherein an output terminal of the driving shift register unit of the m-th stage is connected to a reset terminal of the driving shift register unit of the (m−1) th stage.

6. The gate driving circuit according to claim 1, each of the driving shift register units is configured to output an effective signal after at least one of the first input port and the second input port receives an effective signal.

7. The gate driving circuit according to claim 6, further comprising a first clock supply terminal and a second clock supply terminal, the first clock supply terminal and the second clock supply terminal configured to provide clock signals with opposite phases,
   wherein a first clock signal terminal of a start shift register unit of the odd-numbered stage and that of a driving shift register unit of the odd-numbered stage are connected to the first clock supply terminal respectively, a second clock signal terminal of the start shift register unit of the odd-numbered stage and that of the driving shift register unit of the odd-numbered stage are connected to the second clock supply terminal respectively,
   a first clock signal terminal of a start shift register unit of the even-numbered stage and that of a driving shift register unit of the even-numbered stage are connected to the second clock supply terminal respectively, and a second clock signal terminal of the start shift register unit of the even-numbered stage and that of the driving shift register unit of the even-numbered stage are connected to the first clock supply terminal respectively.

8. The gate driving circuit according to claim 1, wherein each of the start shift register units includes an input module, a pull-up module, a reset module, and a pull-down module.

9. The gate driving circuit according to claim 8, wherein the input module of the start shift register unit includes a fourth transistor, a gate and a first terminal of the fourth transistor are connected to the input terminal of the start shift register unit, and a second terminal of the fourth transistor is connected to a pull-up node of the start shift register unit.

10. A display substrate comprising a plurality of rows of pixel units and the gate driving circuit according to claim 1, each of the driving shift register units corresponds to one of the plurality of rows of the pixel units respectively.

11. A display device comprising the display substrate according to claim 10.

12. A driving method of the gate driving circuit according to claim 1, comprising: in each cycle of display cycle,
    providing an effective signal to the input terminal of the start shift register unit of the first stage, and
    providing an effective signal to the second input port of the driving shift register unit of the first stage.

13. The driving method according to claim 12, the driving method further comprising:
    providing two clock signals with opposite phases by the first clock supply terminal and the second clock supply terminal respectively.

* * * * *